United States Patent [19]
Harston

[11] Patent Number: 5,343,196
[45] Date of Patent: Aug. 30, 1994

[54] D/A CONVERTER WITH REDUCED POWER CONSUMPTION

[75] Inventor: Stephen W. Harston, Limerick, Ireland

[73] Assignee: Analog Devices, Inc., Norwood, Mass.

[21] Appl. No.: 986,146

[22] Filed: Dec. 4, 1992

[51] Int. Cl.$^5$ .................. H03M 1/06; H03M 1/66
[52] U.S. Cl. ................. 341/136; 341/119; 341/144
[58] Field of Search .............. 341/144, 136, 154, 153, 341/118, 133, 135, 119

[56] References Cited
U.S. PATENT DOCUMENTS 5,184,129  2/1993  Fung et al. .................. 341/144

Primary Examiner—Sharon D. Logan
Attorney, Agent, or Firm—Parmelee, Bollinger & Bramblett

[57] ABSTRACT

A D-to-A converter of the type having a number of current sources each connected to a pair of switches operable by binary control pulses for directing the source current either to the output line or to ground. Power to operate the DAC is reduced by special control circuitry which opens both switches of any given switch pair whenever two successive control pulses call for the output-line switch to be open.

12 Claims, 4 Drawing Sheets

| DECODER OUTPUT | | DAC INPUT | |
|---|---|---|---|
| FOLLOWING PULSE (n+1) | PRESENT PULSE (n) | DATAB (n) | DATA (n) |
| — | — | O | — |
| O | — | O | — |
| — | O | — | O |
| O | O | — | — |

FIG.5

D/A CONVERTER WITH REDUCED POWER CONSUMPTION

BACKGROUND OF THE INVENTION

1. Field of the Invention

This invention relates to D/A converters (DACs) comprising an MOS integrated circuit chip having a number of transistor current sources the outputs of which are switchable between an output line and a reference line such as analog ground. More particularly, this invention relates to such converters having means to reduce the amount of current switched to the reference line so as to reduce the overall power consumption of the DAC.

2. Background of the Invention

Many modern D/A converters employ an array of MOS transistor current sources which are switchable by the digital input signal either to an output line or to ground. When the current flows to ground, it performs no useful purpose yet can excessively heat the IC chip and may also require undesirably large size conductors for carrying the supply current into the chip.

One way to reduce this unwanted current flow is to simply open-circuit the current source when the output line switch is turned off. This approach is not satisfactory however because it produces an unacceptable voltage overshoot at the analog output when the output-line switch subsequently is turned back on. This is because there is a fast voltage transition at the MOS current source drain at switch turn-on, and this voltage transition is coupled through to the output line to create a voltage overshoot.

SUMMARY OF THE INVENTION

In a presently preferred embodiment of the invention, to be described hereinbelow, there is provided a current DAC incorporating conventional three-transistor current cells to develop the output current. In such a cell, one MOS transistor serves as a current source, and the other two transistors act as switches to direct the current either to the output line or to ground respectively. The switches of each switch pair are controlled by a series of pulses (ones and zeros) synchronized by clock signals. In accordance with one aspect of the present invention, these incoming pulses are pipelined, with the stream of pulses passing through two successive pipeline stages. At any given instant, a "present" pulse will be in the "leading" stage, and a "following" pulse will be in the "trailing" stage.

Low-power logic circuitry monitors the two pipeline stages to determine the states of the pulses in those stages. Whenever the states of both the "present" pulse and the "following" pulse are such as to call for the current source to be disconnected from the output line, the switch to ground will be turned OFF. Thus, both switches to the current source will be OFF, so that no wasted current can be drawn from the current source.

With such a switch control arrangement, there will be no voltage overshoot at the converter output at the next clock time, i.e., when the original "following" pulse becomes a new "present" pulse. This is because the original "following" pulse, now in the "leading" pipeline stage, will call for the output-line switch to remain OFF.

If the new "following" pulse (now in the "trailing" pipeline stage) calls for current to flow to the output line, the logic will turn the ground-line switch back ON. Current therefore will flow from the current source, and its drain voltage will stabilize at the proper value. When the output-line switch thereafter is turned back ON at the next clock time, there will be no fast voltage transition to be coupled to the output line.

Except for the above-described condition where the states of both the "present" and the "following" pulses call for the current source to be disconnected from the output line, the two switches will be activated just as in a conventional DAC. Under those other conditions, no fast voltage transitions would be developed at the current source drain in any event, so no special switch control is needed.

Accordingly, it is an object of this invention to provide a DAC having reduced current requirements. Other objects, aspects and advantages of the invention will in part be pointed out in, and in part apparent from, the following description considered together with the accompanying drawings.

BRIEF DESCRIPTION OF THE DRAWINGS

FIG. 5 is a truth table describing the operation of the logic circuitry in FIG. 4.

DETAILED DESCRIPTION OF A PREFERRED EMBODIMENT

Figure 1:
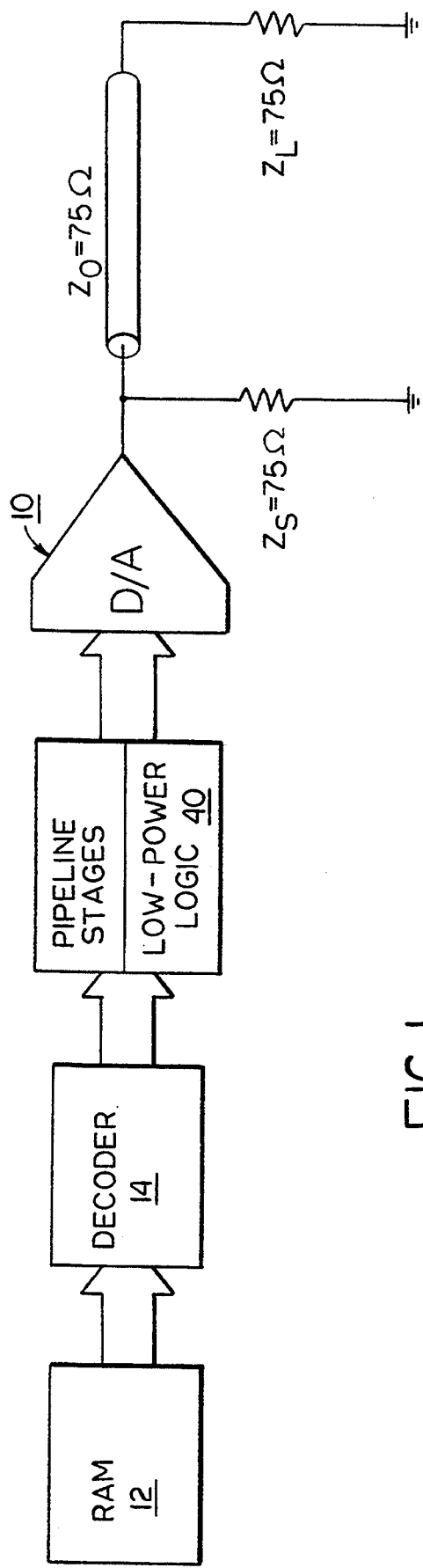
FIG. 1 is a block diagram showing a system including a DAC in accordance with this invention.

FIG. 1 shows elements of a typical system employing a DAC 10, such as described in detail in copending application Ser. No. 649,433 filed Feb. 1, 1991 by Timothy Cummins. That system includes a random access memory (RAM) 12 serving as a color look-up table for a CRT display apparatus. This RAM can for example store 10-bit bytes representing color pixels for a TV screen, The 10-bit bytes are read out and directed to a decoder 14 which produces binary pulses as inputs for the DAC 10. These pulses control the ON/OFF status of current sources in the DAC.

Figure 2:
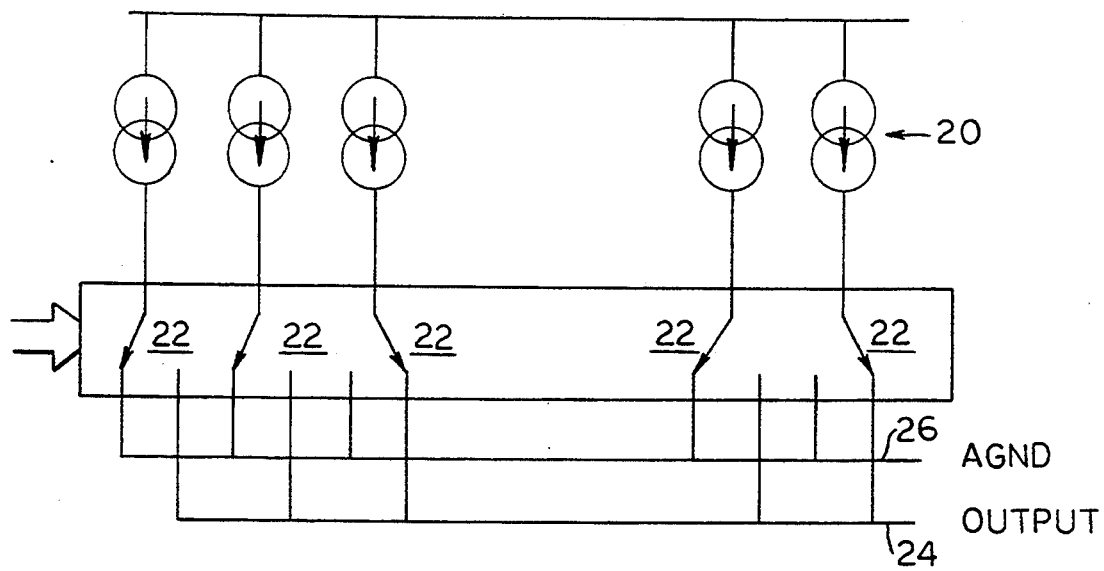
FIG. 2 is a pictorial illustration of the current source and switching arrangement.

The DAC described in the above-identified Cummins application had a 10-bit capability. The four most significant bits were directed to a 4:15 decoder, as illustrated herein at 14. (The remaining six bits were decoded with other circuitry.) The fifteen-line output of the decoder 14 controlled fifteen corresponding current cells in the DAC, including current sources as illustrated pictorially at 20 in FIG. 2. Each current source is provided with a pair of switches 22 for connecting the current source to an output line 24 or to a ground line (AGND) 26.

Figure 3:
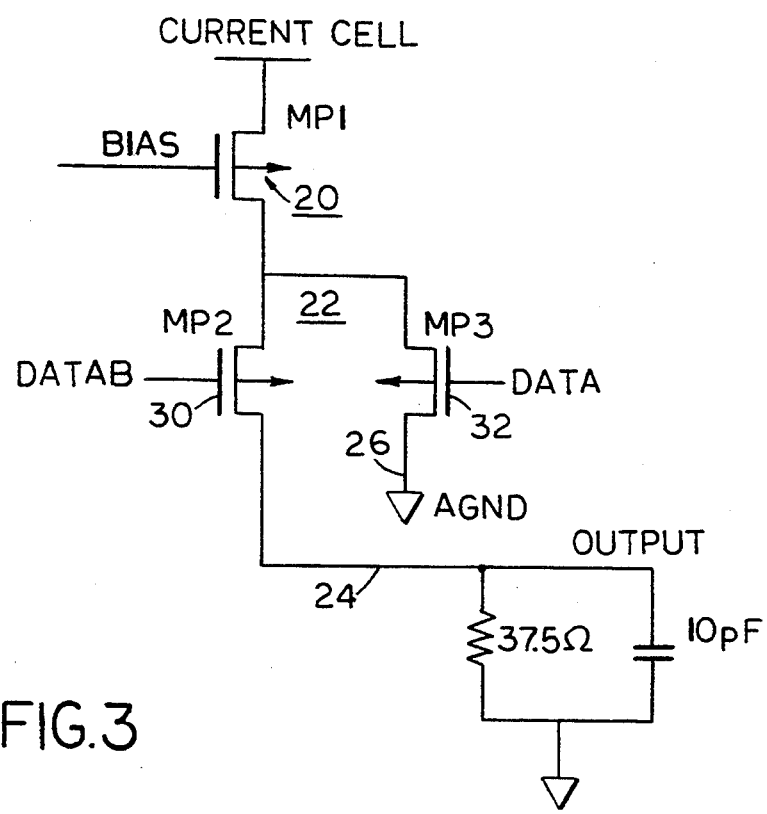
FIG. 3 is a circuit diagram of a three-transistor current cell.

Details of a current cell as used in the preferred embodiment of the present invention are shown in FIG. 3. Here the current source 20 comprises a PMOS transistor MP1. The associated switch pair comprises PMOS transistors MP2, MP3 for connecting the drain of MP1 either to the output line 24 or to AGND 26.

The switch transistors MP2, MP3 include gates 30, 32 which, in the DAC as used in the system disclosed in the above application, will always receive complementary control signals. That is, when one switch is turned ON, the other is turned OFF, and vice versa. In the presently disclosed embodiment, however, the switch control signals for the two switch transistors for each current cell will differ in important respects from that employed in the above pending application. These control signals are developed in the present embodiment by low-power logic circuitry generally indicated at 40 (FIG. 1), and which monitors pipeline stages for the pulse signals developed to the DAC 10, as shown in FIG. 4.

Figure 4:
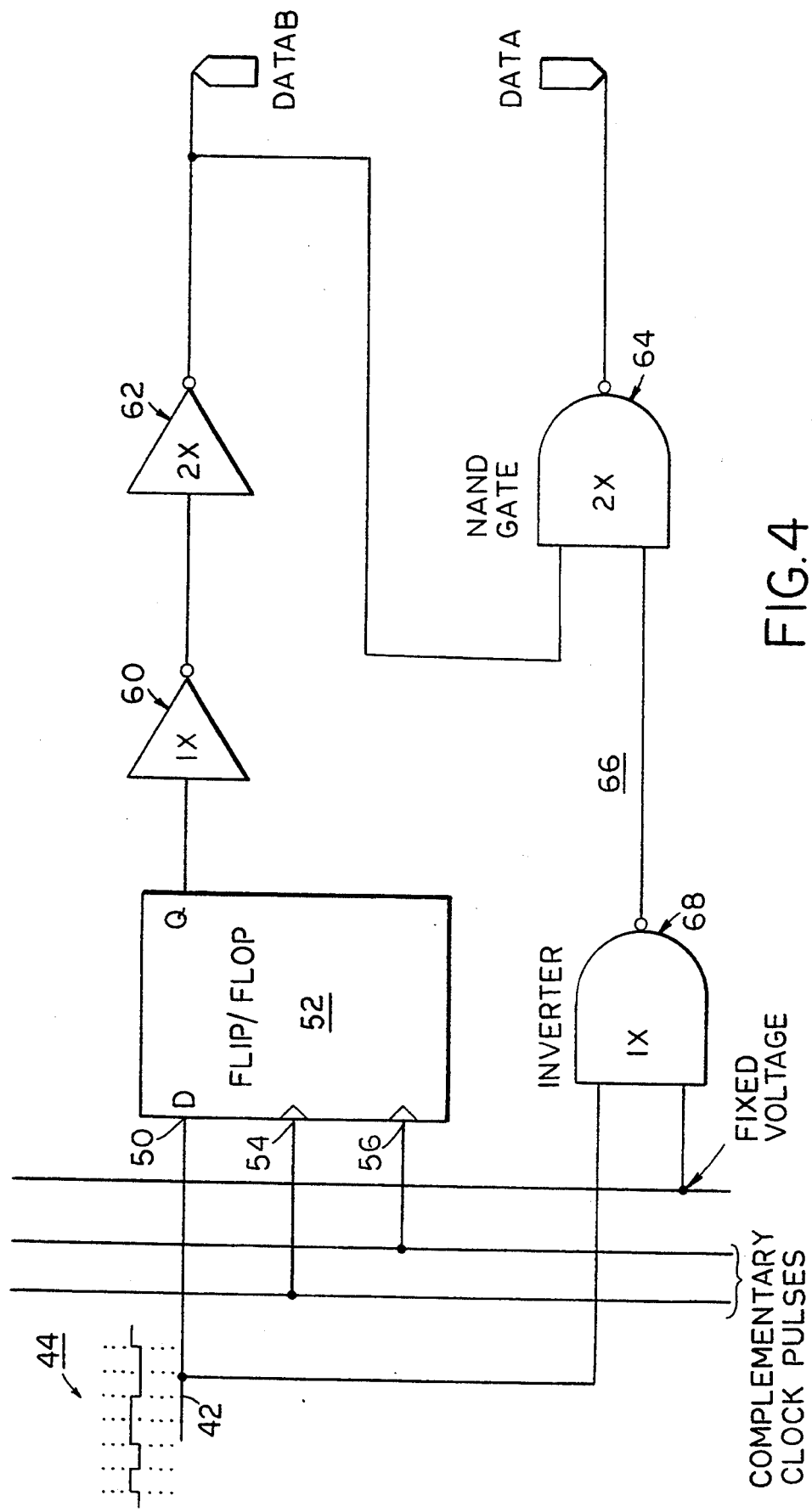
FIG. 4 is a block diagram illustrating two pipeline stages and associated low-power logic circuitry.

At the left-hand edge of FIG. 4, there is shown an input line 42 carrying a stream of pulses (ones and zeros) 44 for a corresponding current cell of the DAC 10. For a 4:15 decoder 14 (as in the above copending application), there will be fifteen such input lines 42 for the fifteen current cells to be controlled.

Each of these fifteen input lines 42 is connected to the input terminal 50 of a corresponding D-type flip/flop 52. Thus there will be fifteen such flip/flops, although for simplicity only one is shown. Each flip/flop also receives complementary clock signals at terminals 54, 56.

When a logic "1" pulse is applied to the input 50 with the output Q at logic "0" there is no immediate change in the output until the next set of clock pulses is received. At that time the output will change as necessary to match the input, i.e., in this instance it will go to a logic "1". The output will remain at "1" until the next clock time, and will change to logic "0" if a logic "0" has in the meantime appeared at the flip/flop input 50.

Thus it will be seen that the stream of input pulses 44 is "pipelined". The input circuitry of the flip/flop 52 serves as one stage of the pipeline, holding the applied input pulse until the next clock time. At that time, as a new pulse is applied to the input 50, the original pulse is transferred to the output circuitry. That output circuitry thus serves as a second stage of the pipeline.

The pipeline stage formed by the output circuitry of the flip/flop 52 is referred to herein as the "leading" stage, and the input circuitry correspondingly is referred to as the "trailing" stage. The output pulse at terminal Q of the flip/flop directly controls the switches MP2, MP3 for the corresponding current source, as will be explained, and thus that output pulse is referred to as the "present" pulse. Similarly, the input pulse at the input terminal 50 is referred to as the "following" pulse.

The Q output of the flip/flop 52 is directed through inverters 60, 62 to a terminal labelled DATAB which is connected (by means not shown) to the gate 30 of the left-hand transistor switch MP2 (FIG. 3). This switch serves, when ON, to connect the current source MP1 to the output line 24.

The DATAB terminal also is connected to one input of a NAND gate 64 forming part of low-power logic circuitry generally indicated at 66 and which also includes an inverter 68 supplying the other input to the NAND gate. This inverter receives as its input the stream of pulses 44 applied to the D input of the flip/flop 52. The resulting output of the NAND gate 64 is directed to a terminal labelled DATA which is connected (by means not shown) to the gate 32 of the right-hand transistor switch MP3 used for connecting the current source to ground.

FIG. 5 presents a truth table showing the operation of the logic circuitry 66 under different states of the pulses in the pipeline stages discussed above. In this table, the "present" pulse is labelled "n" and the "following" pulse is labelled "n+1". The first three lines of this table show that when at least one of the "present" or "following" pulses is logic "one" the DATA and DATAB logic signals are complementary so that one or the other of the switches MP2, MP3 will be ON. The current source 20 will under these conditions produce current flow, to either the output line 24 or the AGND line 26. In this mode, the logic circuitry 68 operates the switches MP2, MP3 in the same fashion as in a conventional DAC. Thus there is no saving of power to the DAC under these circumstances.

The fourth line of the FIG. 5 truth table sets forth the circumstances under which DAC power is reduced. As shown, when both the "present" and the "following" pulses are of a state to call for the output-line switch MP2 to be OFF (i.e., when both pulses are logic "zero"), both switches MP2 and MP3 will be turned OFF at the same time and will remain OFF during that cycle time. (Note: The corresponding gate signals DATA and DATAB are shown as "ones" for this condition because PMOS switches are turned OFF by high logic signals.) With both switches OFF, no current will be drawn from the corresponding current source 20 during that clock time. Thus, the power consumed by the DAC will be reduced, as compared to the conventional operating mode as represented by the first three lines of the FIG. 5 truth table.

It will be seen that both switches MP2 and MP3 are turned OFF simultaneously only when both the "present" and the "following" pulses are logic "zero". If those switches were turned off simultaneously with any other state of the "present" and "following" pulses, a very high voltage overshoot would be produced at the converter output line 24, which is unacceptable for high performance DAC applications.

To explain this in more detail, consider for example that both switches are turned off when the "present" pulse is logic "zero" and the "following" pulse is logic "one". No current would of course flow from the current source 20 during that clock time, and the DAC power would be reduced. During that clock time, the voltage at the drain of MP1 (labelled "X" in FIG. 3) would rise to approximately $V_{DD}$ (the power supply voltage) as the current source ceases to conduct current. If the switch MP2 is turned ON at the next clock, as a result of the "following" pulse having been a logic "one" during the previous clock time, there will be a fast voltage transition on node X to restore the drain voltage to its normal operating level. This transition will appear at the DAC output as a very high voltage overshoot resulting in unsatisfactory performance.

Such a fast voltage transition at node X occurs whenever the current source MP1 is turned on after having been off. To assure that this voltage transition does not affect the DAC output, the logic circuitry 66 will assure that the current source of MP1 turns on only during a time that the output-line switch MP2 is off. This assurance is produced by monitoring both the "present" and "following" pulses and allowing both switches MP2, MP3 to be turned OFF together only when the "following" pulse is of a state to command the output-line switch to be OFF during the next clock time. Thus, when the fast voltage transition occurs at node X, the output-line switch will be OFF, and no voltage overshoot can be transmitted through to the output line 24.

Although a preferred embodiment of the invention has been disclosed herein in detail, this has been for the purpose of illustrating the invention, and should not be construed as necessarily limiting the scope of the invention since it is apparent that many changes can be made by those skilled in the art while still practicing the invention claimed herein.

What is claimed is:

1. An integrated circuit chip formed with a plurality of transistors arranged as a D/A converter and comprising:
   a plurality of current sources;
   a plurality of switch means for said current sources respectively;
   each switch means comprising first and second transistor switches connected between the associated current source and an output line and a reference line respectively;
   signal means for producing a series of pulses for each of said switch means to control in sequence the on/off states of said transistor switches, said series of pulses including successive pulses identified as present pulse and following pulse;
   switch control means for each of said switch means and responsive to the corresponding series of said pulses for producing control signals for directing the on/off condition of the associated transistor switches in accordance with a digital input to said D/A converter so as to produce a corresponding analog output current;
   each switch control means comprising logic means for examining the state of the present pulse and the following pulse in the corresponding series of pulses;
   said logic means including means operable in response to said examination to turn off both the first and the second transistor switches for the corresponding current source upon determining that both the present and the following pulse are of a predetermined state directing that said first transistor switch be turned off to prevent flow of current from said current source to said output line.

2. An integrated circuit chip as claimed in claim 1, including clock means for synchronizing cycles of operation of components of the D/A converter;
   said logic means being arranged to examine said present and following pulses concurrently during a single clock cycle and to effect control of said transistor switches during that cycle.

3. An integrated circuit chip as claimed in claim 1, wherein said first and second transistor switches include control electrodes; and
   means operable with said logic means to develop complementary control signals for the control electrodes of the transistor switches except when said examined present and following pulses are of said predetermined state.

4. An integrated circuit chip as claimed in claim 3, wherein said transistor switches are MOS transistors.

5. An integrated circuit chip as claimed in claim 1, wherein said switch control means comprises pipeline means including at least successive first and second stages;
   said present pulse being that pulse which is in said first stage and said following pulse being that pulse which is in said second stage.

6. An integrated circuit chip as claimed in claim 5, wherein said pipeline means comprises a flip/flop having an input terminal and an output terminal;
   said second stage comprising said input terminal and said first stage comprising said output terminal.

7. In a DAC having a plurality of current sources each with an associated switch pair comprising first and second transistor switches to switch the source current either to an output line or to a reference line respectively, said DAC further including means to develop for each such switch pair binary pulses serving in sequence to control the operation of the switches so as normally to cause the source current to flow to said output line or to said reference line, said pulses including successive pipelined pulses identified as the "present" pulse and the "following" pulse;
   the method of controlling the on/off status of the transistor switches of each pair of switches comprising the steps of:
   examining the states of said "present" pulse and said "following" pulse; and
   turning off both said first and second switches when the states of both said examined pulses are such as to direct that said first switch be turned off.

8. The method of claim 7, wherein said pulses are pipelined by application to the input of a flip/flop controlled by clock pulses;
   said pulse states being examined by monitoring the logic level of the input and output of said flip/flop.

9. The method of claim 7, wherein both switches of each pair are controlled by a series of successive control pulses.

10. The method of claim 9, wherein said control pulses are applied to the input of a corresponding flip/flop;
    the input and output of said flip/flop serving as pipeline stages the logic levels of which are monitored.

11. The method of claim 10, wherein the flip/flop output controls one of said switches directly; and
    the flip/flop input is compared with the flip/flop output to produce a control signal for the other of said switches.

12. In a DAC having a plurality of cells comprising respective current sources each with associated switch means including means to switch the source current either to an output line or to a reference line; said DAC further including means to develop for each such switch means control pulses serving in sequence to control the operation of the switch means so as normally to cause the source current to flow alternatively either to said output line or to said reference line, said control pulses including successive pipelined pulses identified as the "present" pulse and the "following" pulse;
    the method of controlling the status of said switch means comprising the steps of:
    examining the states of said "present" pulse and said "following" pulse; and
    controlling said switch means to prevent any flow of current from the associated current source when the states of both said examined pulses are such as to establish that the source current not be directed to said output line.

* * * * *